（12） United States Patent
Yang

(10) Patent No.: US 12,153,085 B2
(45) Date of Patent: Nov. 26, 2024

(54) MASSIVELY INDEPENDENT TESTERS SYSTEM

(71) Applicant: Hsu Kai Yang, Pleasanton, CA (US)

(72) Inventor: Hsu Kai Yang, Pleasanton, CA (US)

( * ) Notice: Subject to any disclaimer, the term of this patent is extended or adjusted under 35 U.S.C. 154(b) by 0 days.

(21) Appl. No.: 18/589,311

(22) Filed: Feb. 27, 2024

(65) Prior Publication Data

US 2024/0302429 A1 Sep. 12, 2024

Related U.S. Application Data

(60) Provisional application No. 63/451,574, filed on Mar. 11, 2023.

(51) Int. Cl.
*G01R 31/28* (2006.01)
(52) U.S. Cl.
CPC ..... *G01R 31/2875* (2013.01); *G01R 31/2889* (2013.01)
(58) Field of Classification Search
CPC ............ G01R 31/2874; G01R 31/2875; G01R 31/2877
See application file for complete search history.

(56) References Cited

U.S. PATENT DOCUMENTS 6,400,173 B1 * 6/2002 Shimizu .............. H01L 21/6835
324/762.02
11,187,747 B2 * 11/2021 Kagami ............ H01L 21/67288

* cited by examiner

*Primary Examiner* — Tung X Nguyen
(74) *Attorney, Agent, or Firm* — Kunzler Bean & Adamson

(57) ABSTRACT

Apparatuses, systems, methods, and computer program products for massively independent testers systems are disclosed. An apparatus includes a controller, a substrate, a device interface board, multiple tester modules mounted on the substrate, and/or one or more interface buses. One or more components for tester modules are mounted on a device interface board. Tester modules are configured to perform both independent functional and parametric tests. One or more interface buses are in communication with a controller, multiple tester modules, and/or a device interface board to provide one or more of power and a communication link.

20 Claims, 11 Drawing Sheets

MASSIVELY INDEPENDENT TESTERS SYSTEM

CROSS-REFERENCES TO RELATED APPLICATIONS

This application claims the benefit of U.S. Provisional Patent Application No. 63/451,574 entitled "MASSIVELY INDEPENDENT TESTERS SYSTEM" and filed on Mar. 11, 2023 for Hsu Kai Yang, which is incorporated herein by reference for all purposes.

FIELD

This invention relates to semiconductor integrated circuits and more particularly relates to tester systems for semiconductor integrated circuit devices.

BACKGROUND

Semiconductor chip testing in wafer form has not changed much since inception. For example, a general-purpose Automatic Test Equipment (ATE) tester may be used to test a specific product chip or die on a wafer, using probes to make contact with a Die or Device Under Test (DUT) on the wafer to complete electrical tests, or the like. After the tests are completed a wafer chuck may move down and break contact between the DUT and probes, moving to the next die and repeating the process until all dies on the wafer are tested. A general purpose ATE may be very expensive, take a lot of space, and be difficult to provide different temperature environments for testing. Such conventional methods of wafer level testing need to change, especially for high volume chips and chiplets.

SUMMARY

Apparatuses for a massively independent testers system are disclosed. An apparatus, in one embodiment, includes a controller. In some embodiments, an apparatus includes a substrate. An apparatus, in a further embodiment, includes a device interface board. In certain embodiments, an apparatus includes multiple tester modules mounted on a substrate. One or more components for testing, in some embodiments, are mounted on a device interface board. In one embodiment, one or more tester modules are configured to perform independent functional and/or parametric tests. One or more interface buses, in certain embodiments, are in communication with a controller, multiple tester modules, and/or a device interface board, providing one or more of power and a communication link.

Other apparatuses for a massively independent testers system are disclosed. In one embodiment, an apparatus includes a controller. In a further embodiment, an apparatus includes a testers wafer. In some embodiments, an apparatus includes a device interface board. An apparatus, in certain embodiments, includes multiple independent tester dies of a testers wafer. One or more components for tester dies, in some embodiments, are mounted on a device interface board. Tester dies, in one embodiment, are configured to perform independent functional and/or parametric tests. One or more interface buses, in a further embodiment, are in communication with a controller and/or multiple independent tester dies, providing one or more of power and a communication link for the controller and/or the multiple independent tester dies.

Systems for a massively independent testers system are disclosed. In one embodiment, a system includes a first temperature-controlled chuck. A system, in a further embodiment, includes a substrate coupled to a first temperature-controlled chuck. A system, in certain embodiments, includes a device interface board coupled to a substrate. In some embodiments, a system includes multiple independent tester resource sites configured to perform independent functional and/or parametric tests. Independent tester resource sites, in one embodiment, are disposed on one or more of a substrate and a device interface board. A system, in certain embodiments, includes one or more interface buses in communication with multiple independent tester resource sites providing one or more of power and a communication link for the independent tester resource sites. In a further embodiment, a system includes a controller in communication with multiple independent tester resource sites over one or more interface buses.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
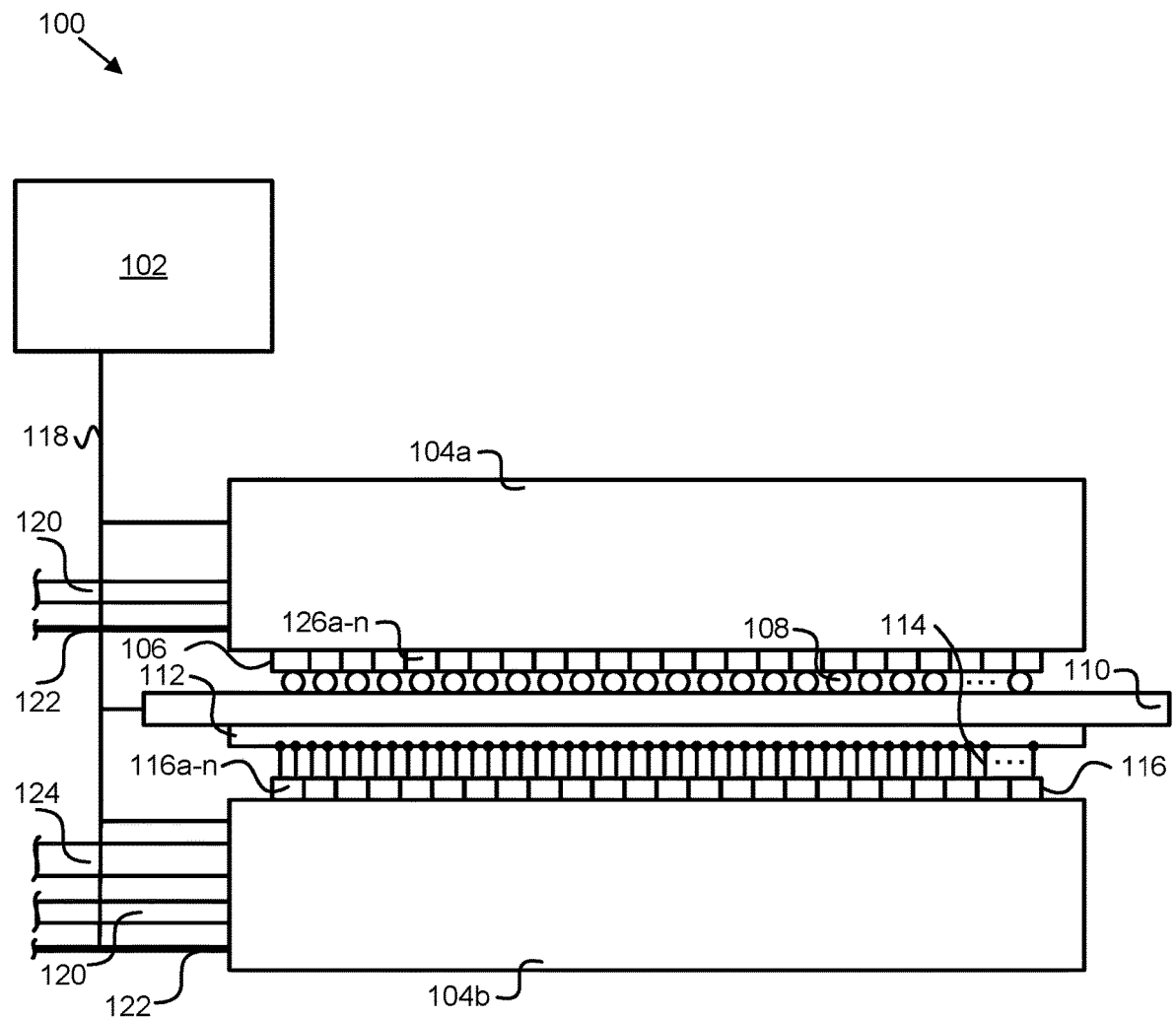
FIG. 1 is a schematic block diagram illustrating one embodiment of a massively independent testers system.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C. As used herein, "a member selected from the group consisting of A, B, and C and combinations thereof" includes only A, only B, only C, a combination of A and B, a combination of B and C, a combination of A and C or a combination of A, B and C.

The words "chip", "die", "die under test" (DUT), and "chiplet" are often used herein. Although DUT may be used to mean die under test and a chiplet may comprise a die used in a 3D multi-die package application, or the like, each of these words may be used interchangeably.

Some wafer sorters are bulky and may have a temperature control system to heat up a device under test and/or a test head. A test head may be multiple printed circuit boards (PCBs) with various functions such as power supplies, pin electronics, controllers, or the like. Test signals generated by these PCBs may get to a DUT via a maze of device interface boards and/or probe cards. Such wafer sorters may be bulky, costly, and/or have heavy tester channel loading for a DUT. Outputs of a DUT, in embodiments with heavy tester channel loading, may be overdesigned just to drive the tester channels. Such testers may be able to test a limited number of DUTs with separate pin electronics but with shared control. When a massive number of DUTs are being tested, heat generated by the DUTs and tester modules themselves may heat up a DUT environment. In some embodiments, smaller and/or more easily manageable thermal control equipment may be advantageous.

FIG. 1 depicts one embodiment of a massively independent testers system 100. In the depicted embodiment, the system 100 includes a controller 102, one or more chucks 104 (e.g., a tester chuck 104a, a device under test chuck 104b, or the like), a tester wafer 106 with a plurality of independent tester dies 126a-n coupled to a device interface board 110 by one or more conductive bumps 108, a probe card 112, one or more vertical probes 114, a device under test wafer 116 with a plurality of DUT dies 116a-n, one or more interface buses 118, one or more coolant channels 120, one or more heaters 122 and/or temperature sensing buses 122, and one or more vacuums 124. A controller 102, in some embodiments, is in communication with one or more of the above-mentioned components of the system 100.

One or more of the testing functions described herein for the tester dies 126a-n may be built using the process technology of the tester wafer 106. Bipolar CMOS (BIC-MOS) technology, for example, may allow certain analog components used by Automatic Testing Equipment (ATE) to be built on a tester wafer 106. In some embodiments, wafer level repairing technologies such as fuse blowing and/or one or more extra metal masking steps to connect verified good components on one or more tester dies 126a-n may enable the test wafer 106 to comprise mostly or all of working tester dies 126a-n.

Components for testing, such as one or more resistors, capacitors, inductors, loads, relays, or the like, which may not be easily and/or practically implemented by a semiconductor process for the tester wafer 106, in some embodiments, may be disposed on a device interface board 110. Micro Electromechanical Systems (MEMS) technology for fabricating tens of thousands or more probes, relays, and/or miniature passive electrical components, in some embodiments, may make whole wafer 116 testing with one touch-down possible.

Each tester die 126a-n, its associated testing components on a device interface board 110 and/or probe card 112, and/or probes 114, in some embodiments, form an independent tester resource. The system 100 may comprise multiple (e.g., a massive number, or the like) independent tester resources up to one for each DUT 116a-n of wafer 116, or more. By targeting the independent tester resources for specific high-volume products, in certain embodiments, the overall requirements may be much simpler compared to other general purpose ATEs, which may have a lot of testing resources sitting idle when testing a specific product, or the like.

This disclosure describes at least two related embodiments of a Massively Independent Testers System (MITS) 100, 400, 500. The system 100 includes a testers wafer 106 mounted on a testers wafer chuck 104a or an integral part of a tester fixture, or the like. An integral fixture, together with a testers wafer 106, DIB 110, probe card 112 with vertical probes 114, temperature sensing, heating/cooling, and inter-DIB interface bus 118, may comprise a fixed tester-structure, or the like (e.g., a tester fixture). The DUT wafer 116 is held by a vacuum 124 to a movable DUT chuck 104b, so that the DUT wafer 116 may be aligned to probes 114 of the tester fixture, being stepped and removed when testing is done, or the like.

Figure 4A:
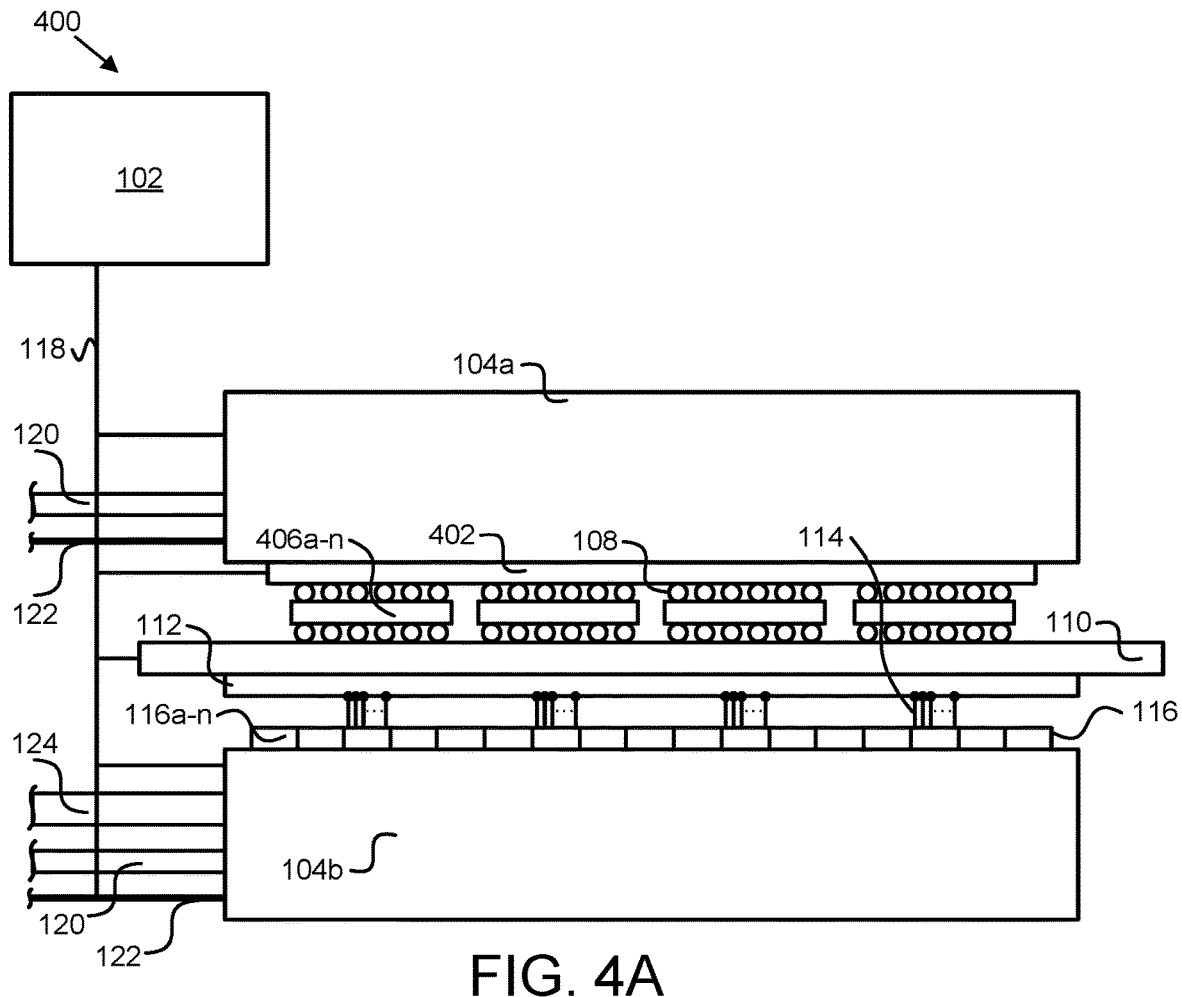
FIG. 4A is a schematic block diagram illustrating a further embodiment of a massively independent testers system.
Figure 4B:
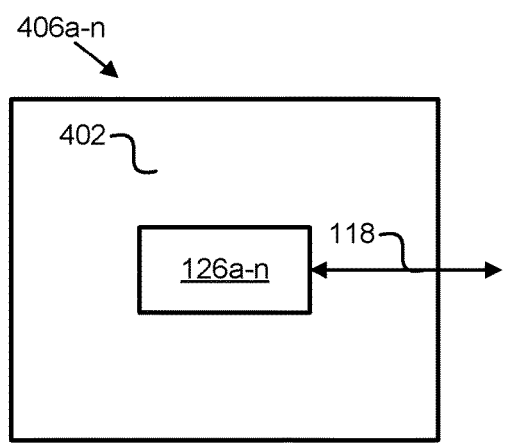
FIG. 4B is a schematic block diagram illustrating one embodiment of a tester module for a massively independent testers system.
Figure 4C:
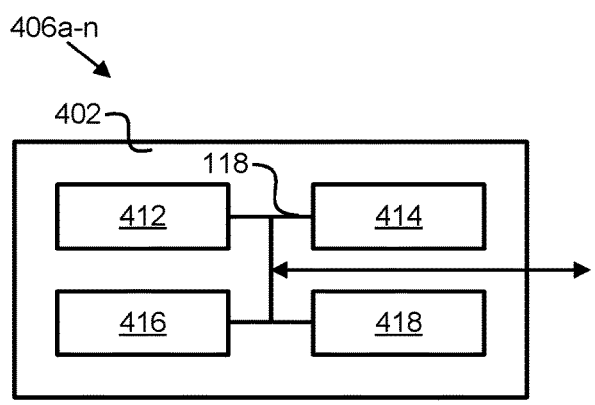
FIG. 4C is a schematic block diagram illustrating a further embodiment of a tester module for a massively independent testers system.
Figure 5:
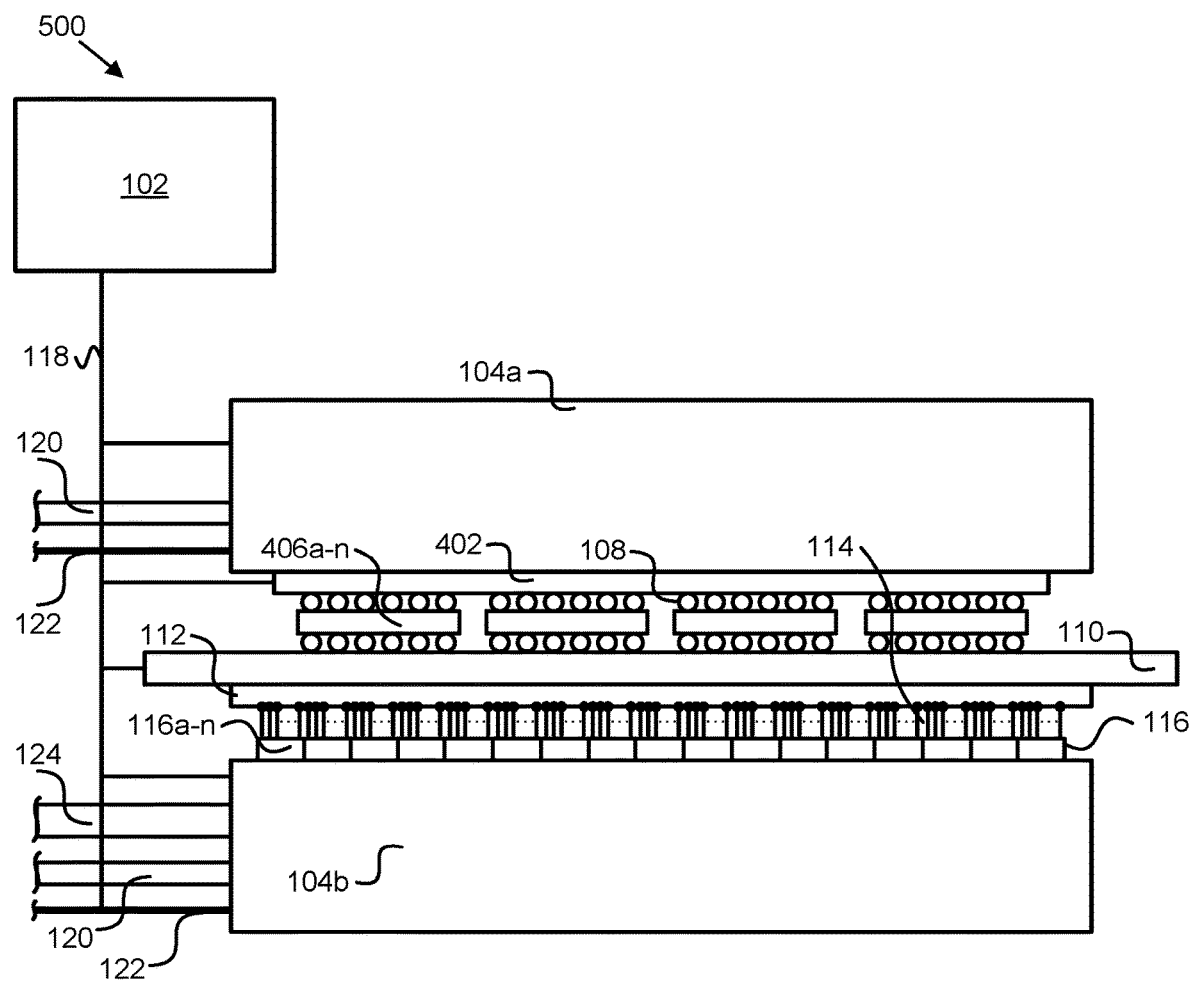
FIG. 5 is a schematic block diagram illustrating one embodiment of a massively independent testers system.

Other embodiments of a massively independent testers system 100 are depicted as the systems 400, 500 described with regard to FIGS. 4A and 5, where instead of a single whole testers wafer 106, many tester modules 406a-n may make up a massively independent testers system 400, 500. The tester modules 406a-n may comprise a fully working tester die 126 as depicted in FIG. 4B, or several separate subcomponents 412, 414, 416, 418, such as Random Access Memory (RAM) 412, Read Only Memory (ROM) 414, and/or Field Programmable Gate Array (FPGA) 416 chiplets and/or one or more dedicated custom designed System On a Chip (SOC) 418 chiplets for tester implementation as depicted in FIG. 4C. The embodiment of a tester module 406a-n depicted in FIG. 4C, in some embodiments, may comprise a custom developed SOC 418, and/or an FPGA 416 which may provide flexibility. Similarly to the tester fixture described above with regard to the system 100 of FIG. 1, in certain embodiments, the system 400 and/or system 500 may comprise a tester fixture.

Figure 2:
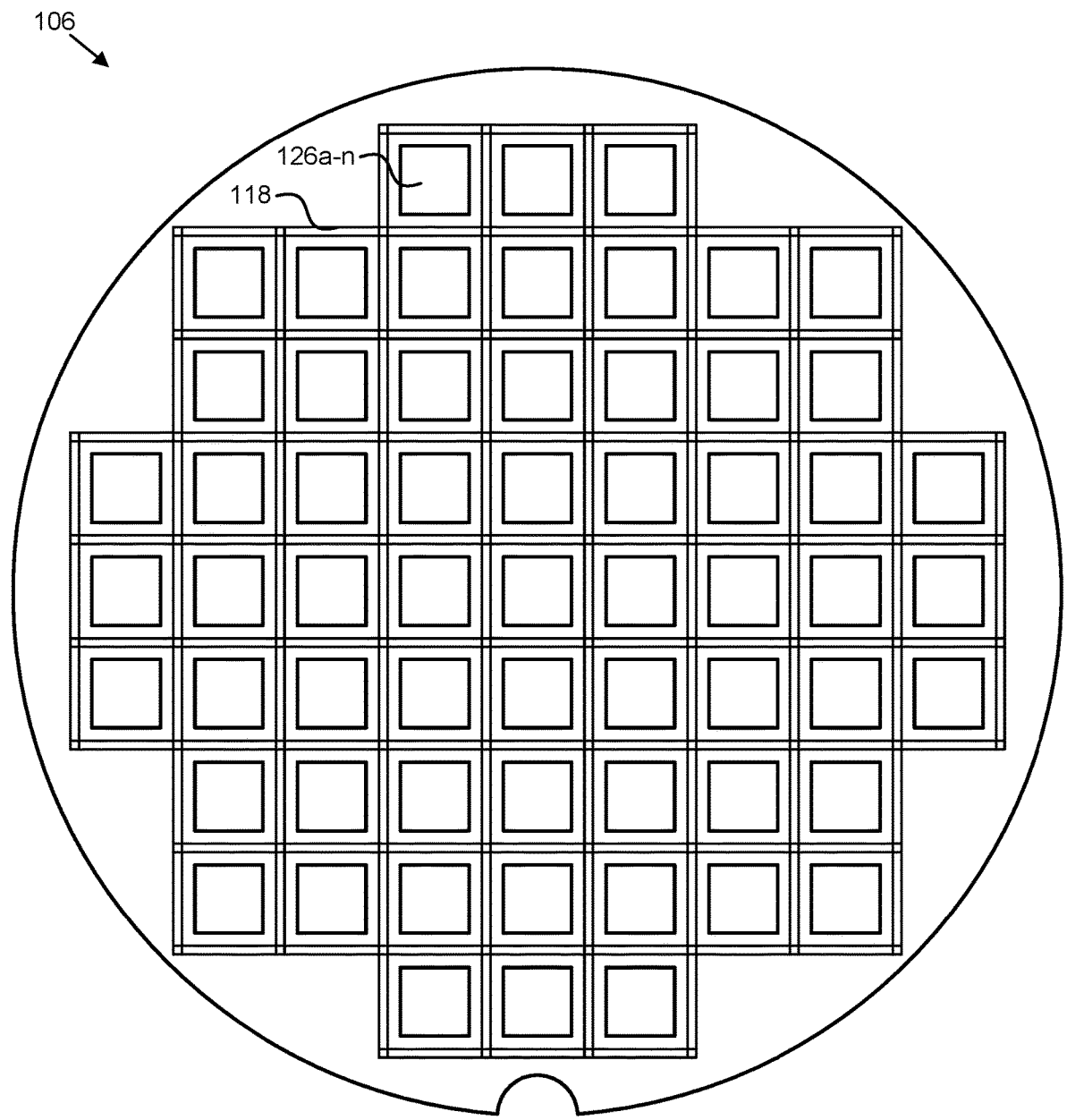
FIG. 2 is a schematic block diagram illustrating one embodiment of a testers wafer for a massively independent testers system.

FIG. 2 depicts one embodiment of a testers wafer 106 for a massively independent testers system. The testers wafer 106, in the depicted embodiment, comprises tester dies 126 and inter-tester dies buses 118. Sizes of the testers wafer 106 and/or of the tester dies 126, in some embodiments, may match sizes of the DUT wafer 116 and/or of the DUT dies, to achieve one touch-down testing or the like. Multiple steppings of the DUT chuck 104b may be used in embodiments where a testers wafer 106 is smaller than a DUT wafer 116 or a tester die 126 is larger than the DUT die 116 in order to test all the dies on DUT wafer 116, or the like.

The inter-tester dies bus 118, in some embodiments, comprises a collection of metal and/or other conductive lines 118, such as a power supply bus 118 for the tester die 126a-n and DUT die 116a-n that can be controlled separately, a reference voltage, a timing reference, a data bus 118 to load test programs to and read test results from the tester die 126, a serial bus 118 connecting to a main off-wafer controller 102, a connection 118 to an inter-DIB board 110 bus 118 via the bumps 108 along various points of the inter-tester dies bus 118, or the like. In certain embodiments, one or more functions of an inter-tester dies bus 118 and an inter-DIB board bus 118 may be substantially similar and/or overlapping. An inter-tester dies bus 118, in one embodiment, may be in communication with a main off-chip wafer controller 102 through one or more inter-DIB board buses 118, or the like.

Figure 3:
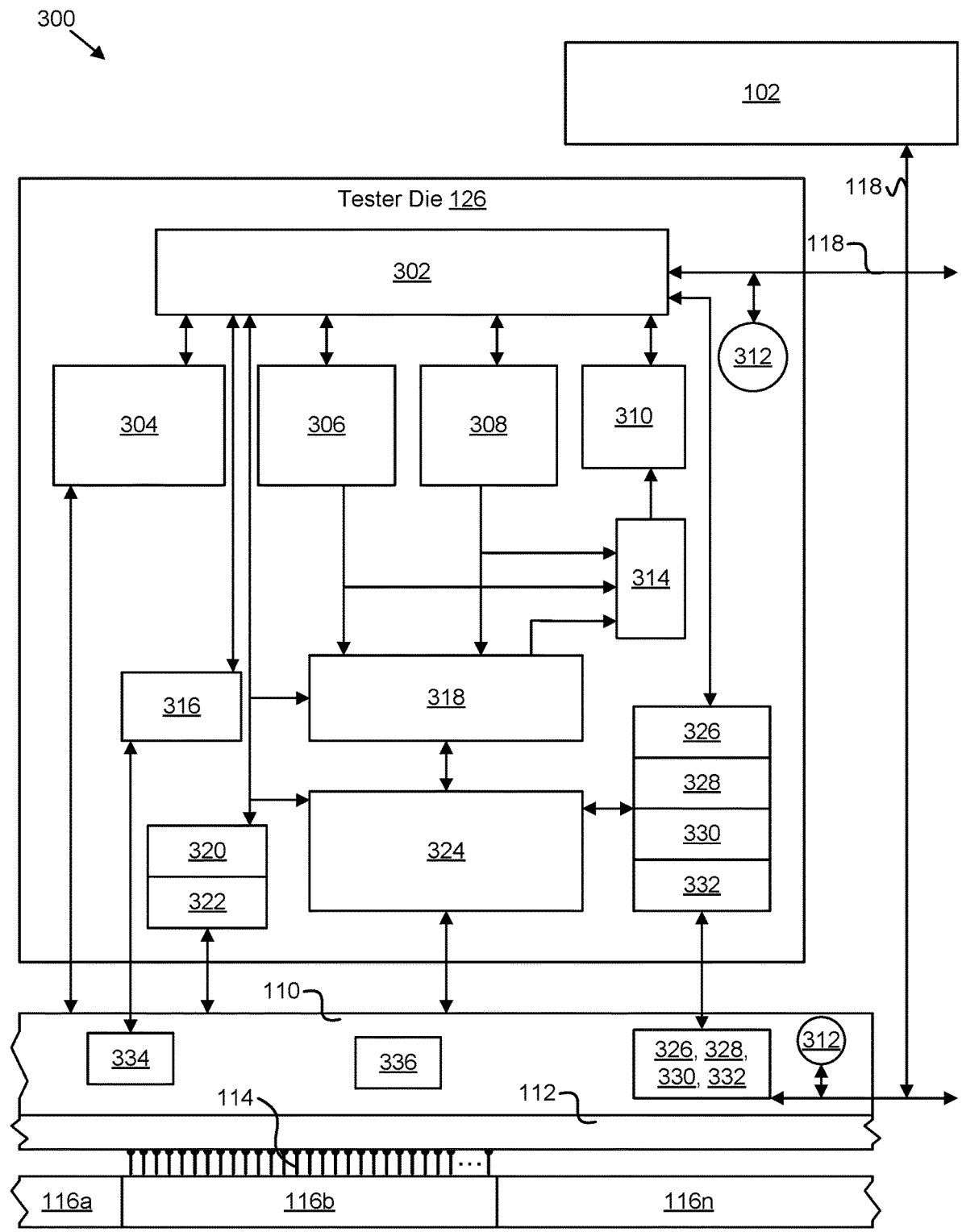
FIG. 3 is a schematic block diagram illustrating a certain embodiment of a massively independent testers system.

FIG. 3 depicts one embodiment of a massively independent testers system 300. A tester die 126 may comprise different components depending on the DUT 116a-n functions to be tested. For example, the system 300, in certain embodiments, may include a tester die 126 for a mixed signal SOC DUT, with embedded memory. The system 300, in the depicted embodiment, further includes a DIB 110, a probe card 112 with vertical probes 114, and a DUT wafer 116.

In one embodiment, memory functions are tested by a memory test unit 306 with address/data generation functions. Digital functions may be tested by test vectors generated by fault coverage software and stored in test vectors ram 308. The test data, input and expected output, for the DUT 116a-n can be selected by multiplexer (MUX) 318 either from the test vector ram 308 or generated by memory test functions 306. The input data may further be formatted by timing generators 328, a reference voltage 330, or the like before being sent to the DUT 116a-n.

Output data from the DUT 116a-n may be compared with the expected data in the test vector ram 308 and/or memory test functions 306, to determine if the output data meets timing and/or level requirements, or the like. A testers controller 302, in some embodiments, is configured to determine one or more actions to take based on the test results. Error data generated by a comparator 314 may be stored in error RAM 310 and/or may be sent to the main off wafer controller 102 for data analysis, or the like.

Power supplies 326 for the tester die 126 and/or reference voltage 330 or current may be generated on the tester die 126, by chiplets on the DIB 110, and/or directly brought in through the inter-tester dies bus 118 or through the inter-DIB board bus 118.

If the DUT 116a-n has analog functions, the tester die 126 may include analog testing circuits 304 that are compatible with the tester die 126 wafer 106 process technology, such as Digital Signal Processing (DSP), sampling, digitizing functions, or the like. In a further embodiment, one or more analog testing circuits 304 may be implemented as chiplets and included on a DIB 110.

Some complex SOC DUTs 116a-n, may comprise multiple SOC functions with Built-In Self Tests (BIST) 320 and repair 322 features, such as JTAG boundary scan, IEEE 1500, and/or other BIST standards. High density memory chips may also have standard and/or custom BIST 320 and/or repair 322 features. The BIST 320 and/or repair 322 functional blocks on the tester die 126, in some embodiment, may be designed to accommodate specific BIST 320 and/or repair 322 functions of a DUT 116a-n.

One or more temperature sensors 312, in some embodiments, may be configured to measure a temperature for the tester die 126 at a certain location. One or more on chip temperature sensors 312 may be controlled by one or more serial buses, such as I2C and/or SPI buses. The locations of each tester die 126, in certain embodiments, may be programmed as unique slave addresses of an I2C bus, as unique chip select of a SPI bus, or the like. An individual temperature sensor 312 reading of the tester dies 126 may be read by the main off wafer controller 102 to regulate the overall testers system 300 temperature, or the like.

One or more testing functional blocks 304, 306, 308, 310, 312, 314, 316, 318, 320, 322, 324, 326, 328, 330, 332, 334 may be in communication with and/or controlled by the testers controller 302. The testers controller 302, in one embodiment, stores one or more test programs. The testers controller 302 may control the testing sequence and/or testing conditions of each test, functional and/or parametric tests. The testers controller 302, in a further embodiment, may also interface with the main off wafer controller 102. The testers controller 302 may be configured to operate independently from other testers controllers 302 on other tester dies 126 on the testers wafer 106, or the like.

The inter-tester dies bus 118 may be accessible to all the tester dies 126 on the testers wafer 106, as described above, such as power buses 118 to provide power supplies 326, reference voltage 330 and/or current, and timing 328 for the tester die 126, and/or power supplies 326 for the DUT 116a-n. One or more data buses 118 and/or serial buses 118 may be for the tester die 126 to communicate with the main off-wafer controller 102 and/or to load a test program, or the like. The main off-wafer controller 102, in certain embodiments, may dynamically select tester dies 126 to run testing DUTs 116a-n in order to control a temperature, or the like.

Some components, such as power supplies 326, a Phase Lock Loop (PLL) within a timing generator 328 capable of being a frequency multiplier or divider for timing generators 328, a reference V/I voltage and current 330, and/or a Precision Measurement Unit (PMU) 332 for individual tester resources may be located either on the tester die 126 and/or on the DIB board 110.

Certain tester components (e.g., macros, VHSIC Hardware Description Language (VHDL) models and/or firmware, or the like) may be standardized and re-useable for different families of DUTs 116a-n. In such an embodiment, it may not be necessary to generate new tester components for every new product or other new DUT 116a-n. Some customizations at a DIB 110 level, or even at a probe card 112 level, in some embodiments, may cover an entire family of products.

Tester components may be individually tested (e.g., by an ATE or the like) to decide which ones are good or to be repaired or replaced by good components to form a functionally good tester die 126 to be connected to the functionally good components on DIB boards 110. The removing or repairing of defective tester components may be accomplished by one or more methodologies such as laser cutting, blowing fuse, and/or thin oxide devices. In some embodiments, an extra metal mask may be employed to connect good tester components, program unique slave addresses of different tester dies 126, and/or connect inter-tester dies buses 118 to the tester dies 126. This extra metal mask may be of a low resolution, at microns or tens of microns level, so that the extra metal mask may not significantly add to a total cost.

Bumps 108 and/or micro bumps 108 may be added for interconnections to one or more DIBs 110. The functional tester dies 126 in conjunction with verified functional components on a DIB 110 complementing the tester dies 126 may form a massively independent testers system 100, 300.

In some embodiments, a majority of area of a tester die 126 may comprise the test vector RAM 308. The test vector RAM 308 may be partitioned to store test program and/or error data. All or most of other logic functions on a tester die 126, in one embodiment, may be programmed into an FPGA, or the like. So, in certain embodiments, a logic process compatible with test vector RAM 308 (e.g., SRAM) and an FPGA may be chosen for a tester die 126 wafer 106 process technology.

Using MEMS and/or chiplet technology, in one embodiment, one or more active components that are not compatible with the tester die 126 wafer 106 process, along with passive loads and/or relays, may be built on a DIB 110 and/or a collection of smaller DIBs 110. In certain embodiments, a vertical probe 114 probe card 112 with MEMS technology may be used for one touch-down testing of an entire wafer 116 (e.g., 200 mm or 300 mm size wafer 116, or the like).

The inter-DIB board bus 118 may be connected directly with the main off-wafer controller 102, which may comprise a decision making controller 102 and/or other functional components for inter-DIB board bus 118 functions as described previously.

A small fast Buffer RAM 336 chiplet, as fast or faster than a DUT 116a-n, may be disposed on a DIB 110. For example, if the tester die 126 wafer 106 technology is not as advance as the DUT wafer 116 technology, a small fast buffer RAM 336 disposed on the DIB 110 may be able to test at DUT 116a-n speeds. This may keep the cost of tester die 126 wafer 106 cost low and/or re-usability longer. The area of fast Buffer RAM 336 chips may be comparatively small. For example, SRAM may be obtained through foundry shuttle runs without incurring the entire mask set and wafer run costs, or the like. One or more temperature sensors 312 may also be mounted at various locations of the DIB 110.

FIG. 4A depicts one embodiment of a massively independent testers system 400. To make an entire testers wafer 106 with functional tester dies 126a-n matching all dies 116a-n on a DUT wafer 116 can be challenging. In one embodiment, instead of a unitary, single testers wafer 106, the system 400 comprises multiple functional tester modules 406a-n, which may be verified individually to build up a MITS. FIG. 4A depicts a MITS with one tester module 406a-n to test several DUTs 116a-n by stepping through them with several probe card 112 touch downs.

FIG. 5 shows a MITS with one tester module 406a-n to test several DUTS 116a-n with one touch-down by sequencing each DUT 116a-n testing with relays and/or switches. These tester modules 406a-n, in some embodiments, may fully populate the space allowed, rather than having spaces left between the adjacent modules 406a-n as shown in FIG. 4A. One or more technologies, such as Re Distribution Layers (RDL), bridge, Trans Silicon Vias (TSV), or the like which may connect fully functional chiplets of different process technologies side by side or on top of each other to make fully functional tester modules 406a-n. MEMS relays, switches, and/or functional chiplets may also be built on the DIB 110 to complement tester modules 406a-n and/or tester dies 126a-n as described previously.

FIG. 4B depicts one embodiment of a tester module 406a-n for a massively independent testers system. A fully functional tester module 406 may be achieved in two or more different ways, in different embodiments. In one embodiment, a fully working tester module 406a-n may comprise a verified tester die 126 described previously (e.g., with or without repairing) and depicted in FIG. 4B, disposed on a substrate 402 or the like.

FIG. 4C depicts a further embodiment of a tester module 406a-n for a massively independent testers system. A tester module 406a-n of FIG. 4C may comprise multiple different independent product dies 412, 414, 416, 418, or the like, such as an FPGA 412, volatile memory 414, non-volatile memory 416, and/or a SOC 418. An FPGA 412 (e.g., as a chiplet), being programmable, may provide flexibility to the tester module 406a-n and/or reduce a need for a new tester SOC 418. The tester SOC 418 may comprise some or all of the components of the tester die 126 of FIG. 3, less functions that can be performed by an FPGA 412, RAM 414, and/or ROM 416 or NAND Flash 416, each of which may be separate chiplets, or the like, disposed on a substrate 402 and in communication over a bus 118 or the like.

These components may be fully tested before being assembled as a tester module 406a-n. The actual input/output circuits 334 the DUT 116a-n interfaces with in a system application may be incorporated in a device interface board 110. In this manner, in certain embodiments, the DUT 116a-n may be tested in an environment closely resembling its actual application. A ROM 416 or NAND Flash 416 may be included to serve as a boot ROM for the FPGA 412. A test program may be programmed in and loaded into RAM 414. Interim test results may be stored in RAM 414 or NAND Flash 416 to reduce the traffic on the inter-tester module or inter-DIB board buses 118. This data may be uploaded to the main off-wafer controller 102 during non-testing time such as wafer 116 set-up or off-load or temperature transition times, or the like. Some or all of the power supplies or signals related to the tester module 406a-n may be connected to the inter-tester modules bus 118 via tester modules substrate 402 and/or also be connected to inter-DIB board bus 118 via the DIB 110.

The Inter-tester Modules Bus 118 of FIG. 4C may serve a similar function as the Inter-tester Dies Bus 118 of FIG. 4B, communicating with the main off-wafer controller 102, or the like. Some of the power lines in this bus 118, in some embodiments, may be minimized and/or reduced by using backside power delivery through PowerVia, or the like. This bus 118 may be segmented to reduce its total loading. Test program data lines in this bus 118 may be reduced by preloading the test programs in ROM 416 or NAND Flash 416 as described above.

Frequency multipliers or dividers, in certain embodiments, may allow each tester module 406a-n to operate at different testing frequencies, thereby having different power dissipation. One or more components of the DIB 110, as described above, in other embodiments, may be located on a tester module 406a-n and vice versa.

FIG. 5 depicts one embodiment of a massively independent testers system 500. In some embodiments, fast buffer RAM 336 on the DIB 110 for a one touch-down embodiment, may also be organized as one per DUT 116a-n, one per tester module 406a-n, or the like. A tester resource for a tester module 406a-n with one or more power supplies and its associated testing components may be disposed on the DIB 110, including vertical probes 114 capable of independently testing a DUT 116a-n. As shown in FIG. 4A, a tester resource may be used by surrounding dies, or the like.

Figure 6:
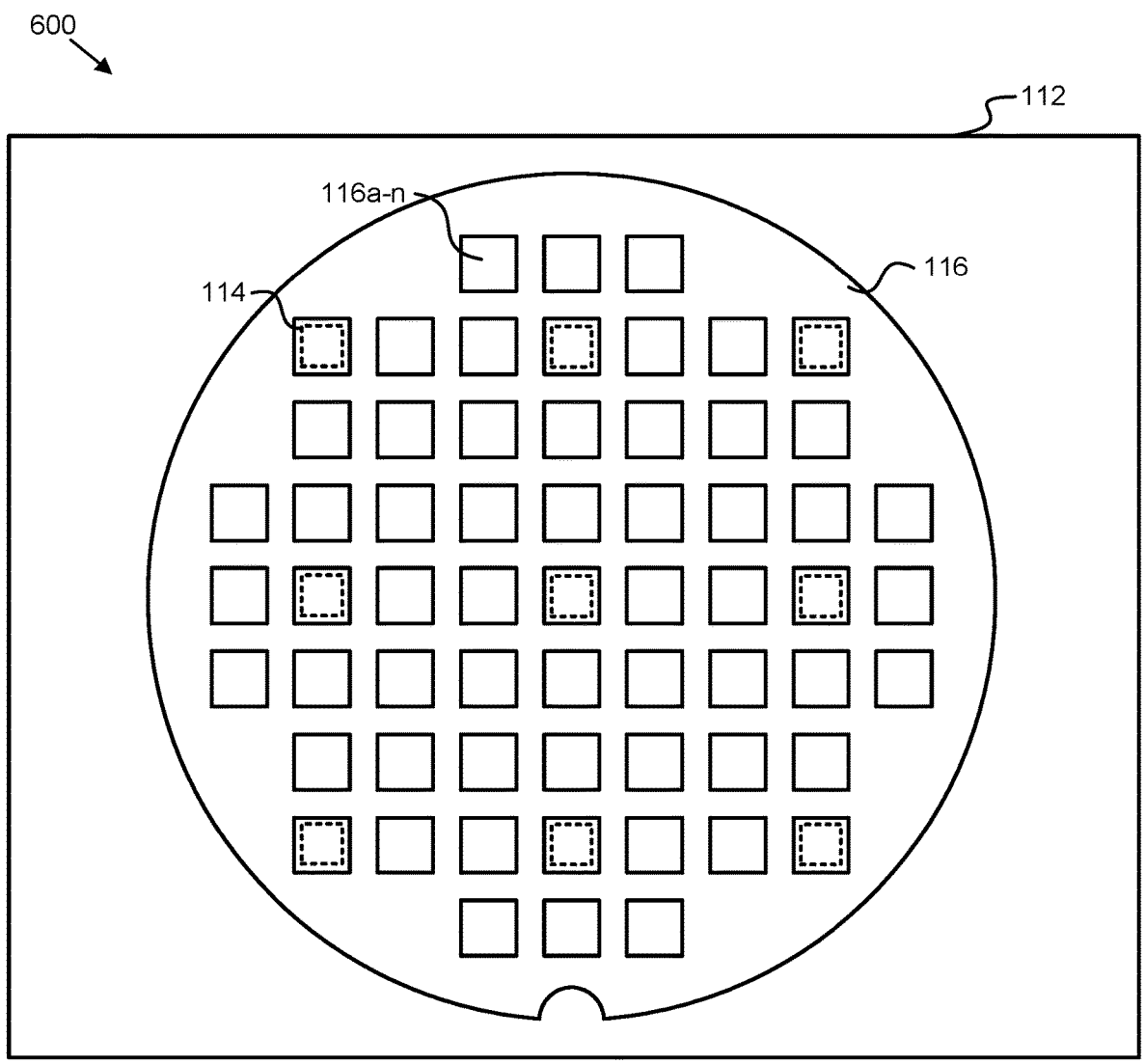
FIG. 6 is a schematic block diagram illustrating one embodiment of a probe card and a device under test wafer for a massively independent testers system.

FIG. 6 depicts one embodiment of a probe card 112 with probes 114 and a DUT wafer 116. Tester resources, as indicated at locations with vertical probes 114, may be located as depicted in FIG. 6. Eight DUTs 116a-n surrounding a DUT 116a-n with vertical probes 114 may be tested by stepping through eight times after the first DUT 116a-n is tested. The arrangements of tester resources may be done in many different ways, FIG. 6 is only one example. One touch down testing may be achieved with vertical probes 114 for every DUT 116a-n, as depicted in FIG. 5. The tester resources may be brought to each DUT 116a-n in sequence by relays, or the like.

Figure 7A:
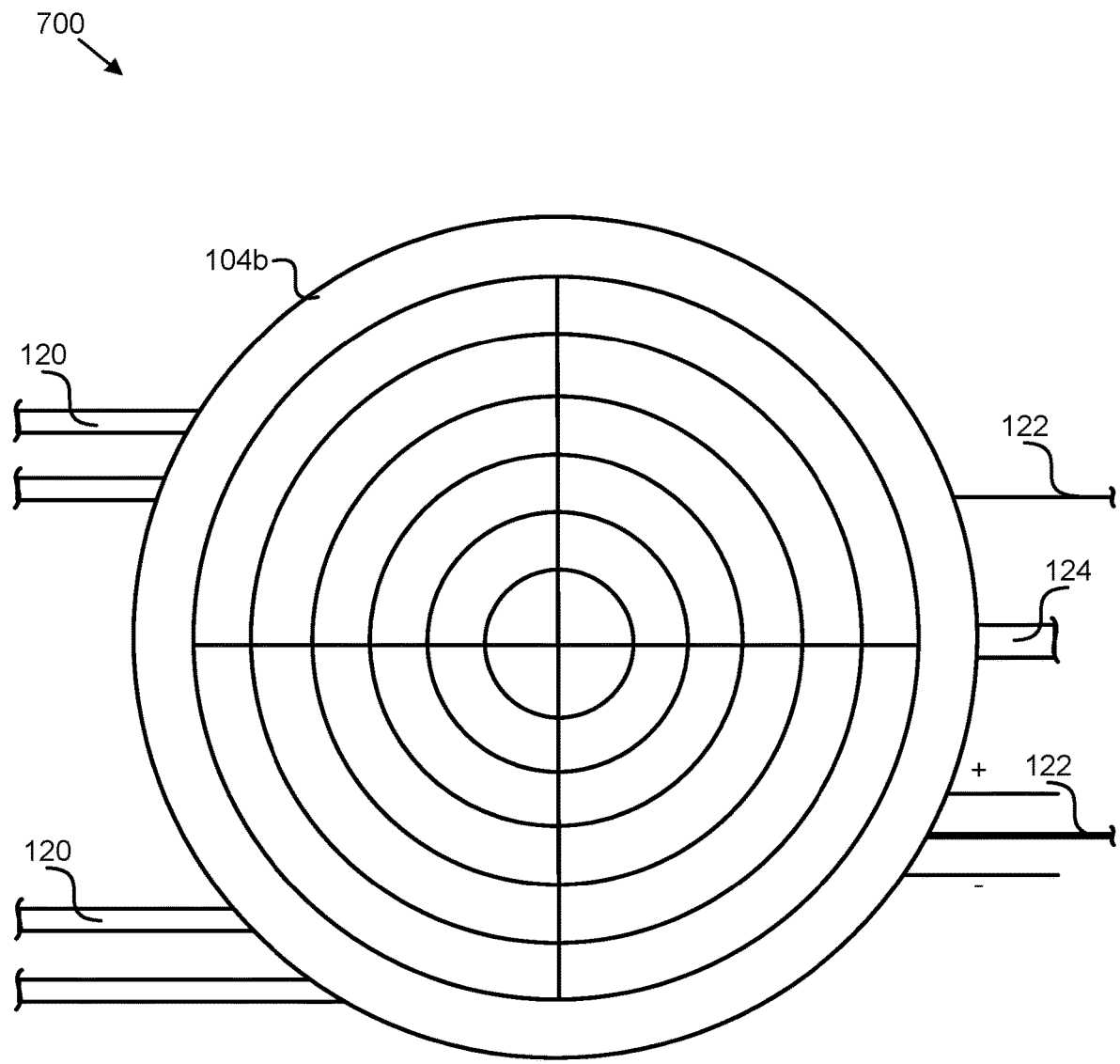
FIG. 7A is a schematic block diagram illustrating one embodiment of a chuck for a massively independent testers system.
Figure 7B:
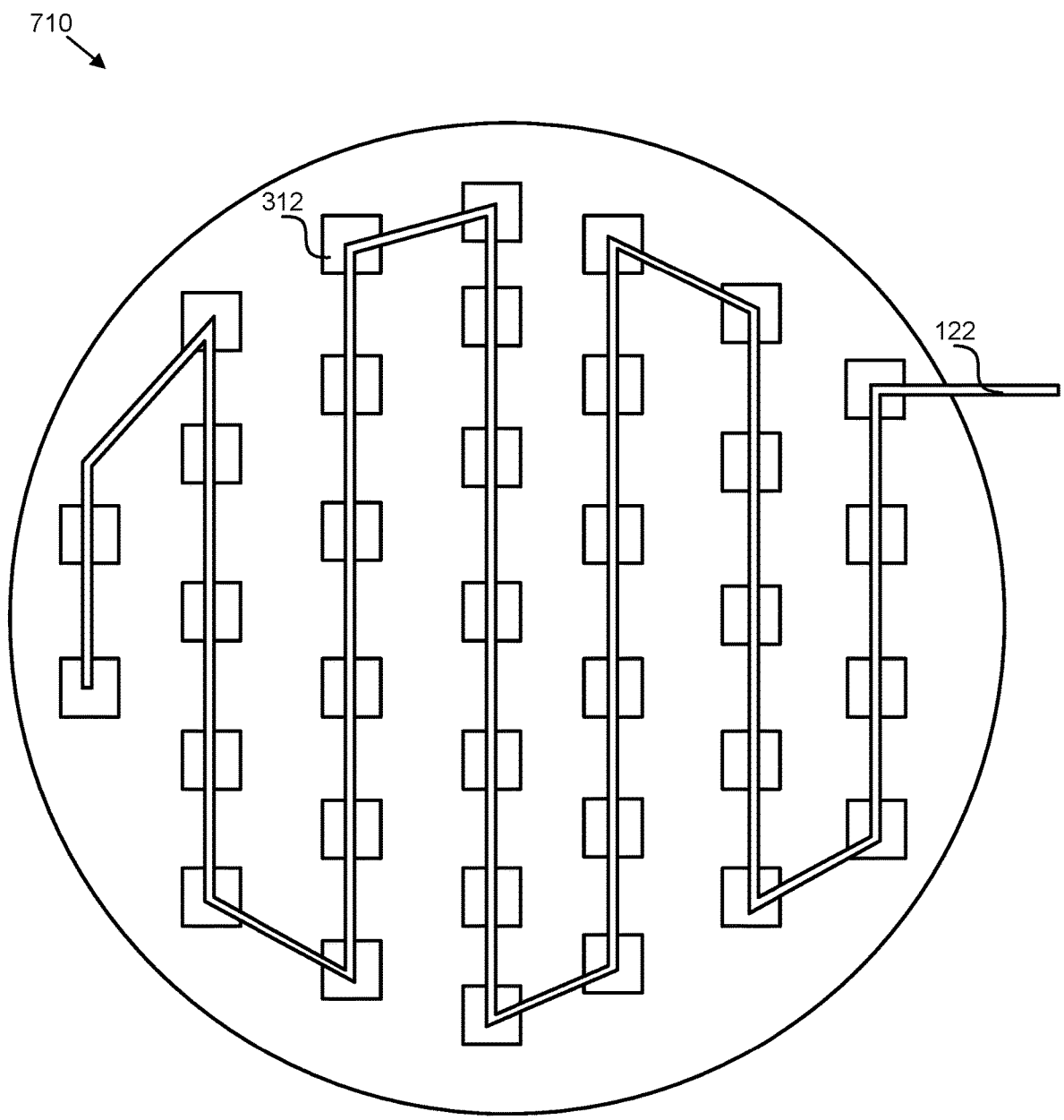
FIG. 7B is a schematic block diagram illustrating a further embodiment of a chuck for a massively independent testers system.
Figure 7C:
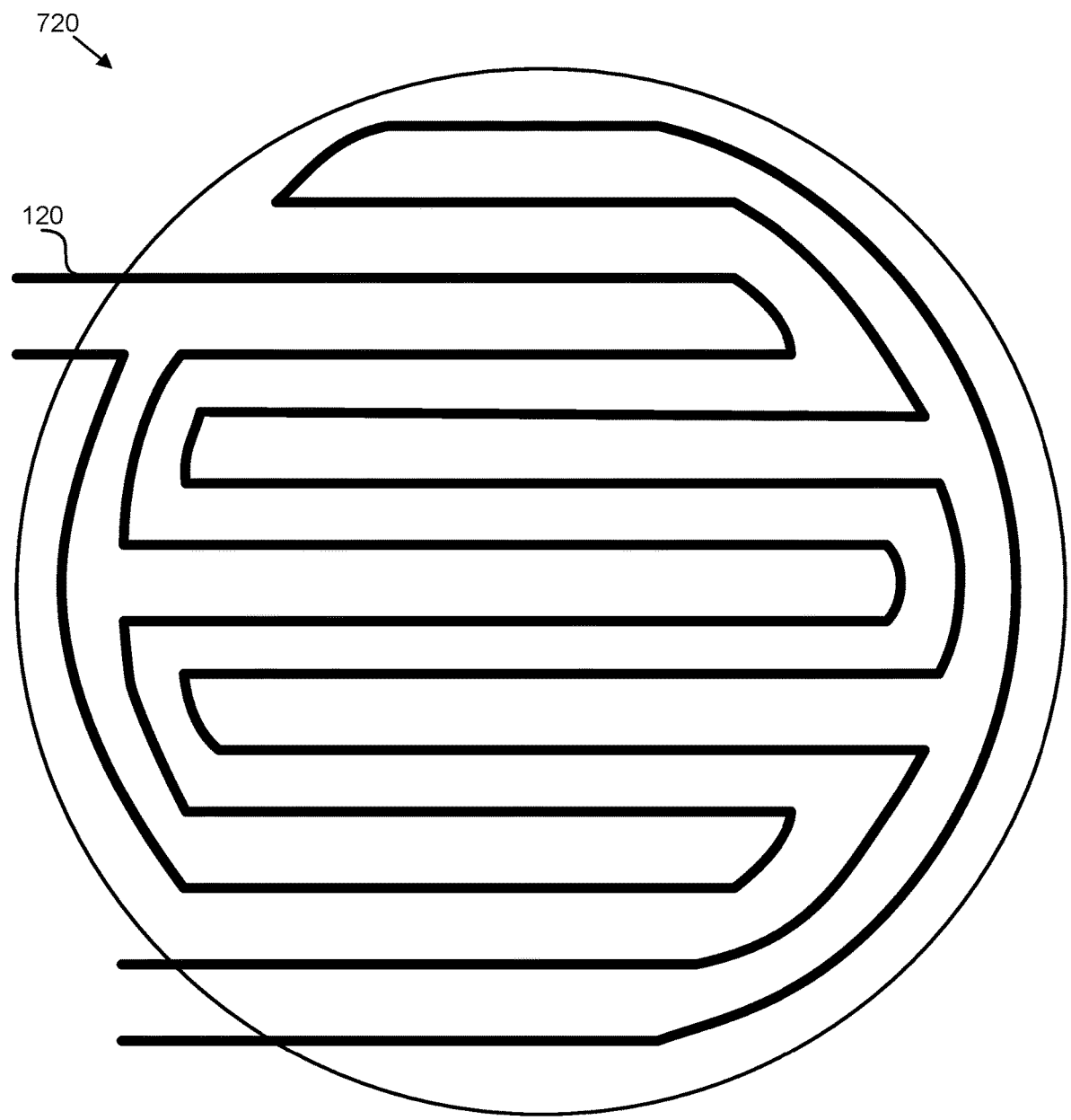
FIG. 7C is a schematic block diagram illustrating a certain embodiment of a chuck for a massively independent testers system.
Figure 7D:
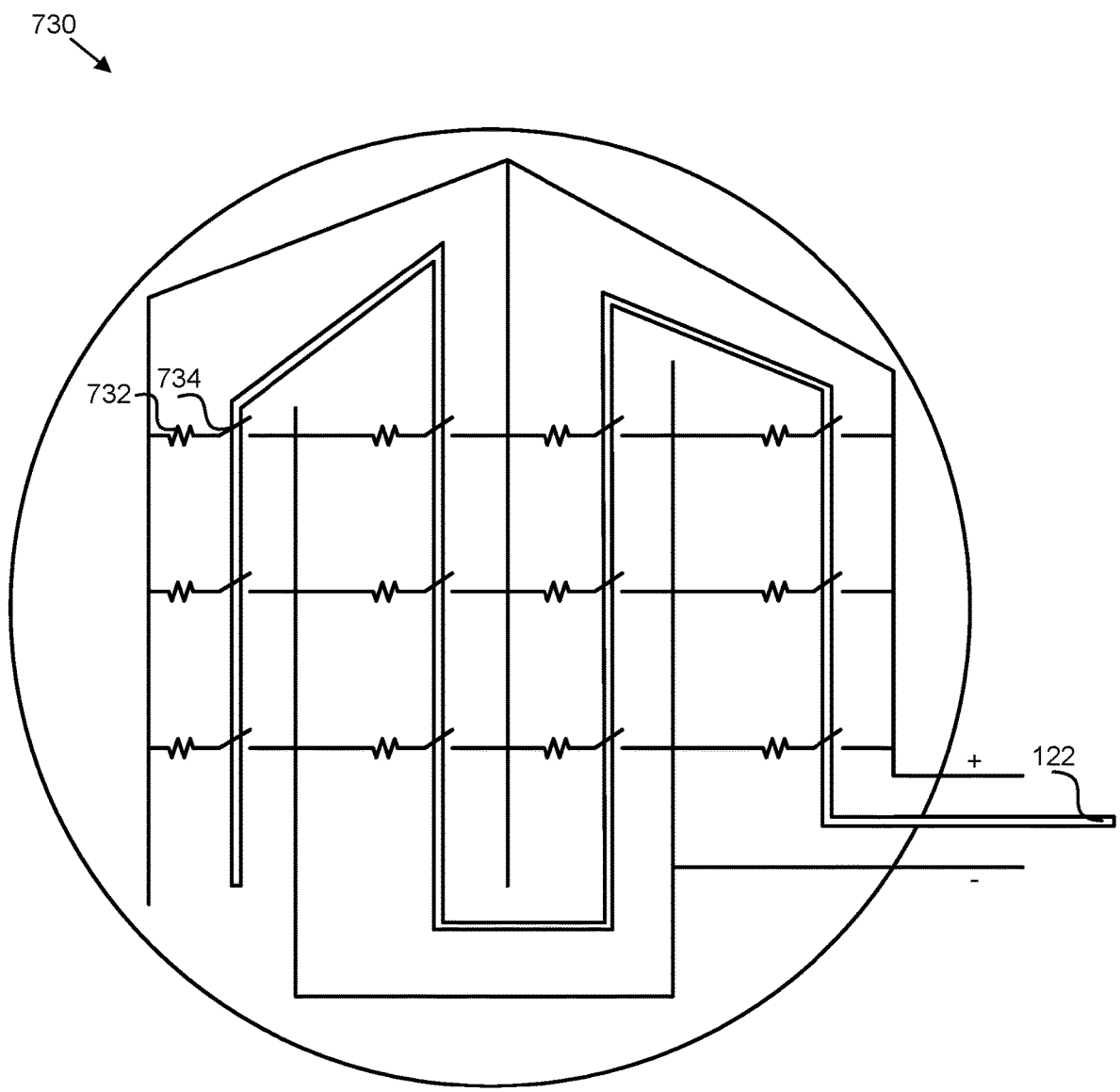
FIG. 7D is a schematic block diagram illustrating another embodiment of a chuck for a massively independent testers system.

FIG. 7A depicts one embodiment of a chuck 700, FIG. 7B depicts one embodiment of a chuck 710, FIG. 7C depicts one embodiment of a chuck 720, and FIG. 7D depicts one embodiment of a chuck 730, each for a massively independent testers system. The DUT chuck 104b and testers wafer chuck 104a, in some embodiments, may be functionally similar. FIG. 7A depicts a DUT chuck 104b. Both a DUT chuck 104b and a testers wafer chuck 104a may have heating 122, cooling 120, and temperature measurement 122 capabilities. The DUT chuck 104b may also include vacuum 124 capability to hold a DUT wafer 116. The testers wafer 106 or tester modules substrate 402 may be permanently mounted on a testers wafer chuck 104a which can be an integral part of a tester fixture, rather than using a vacuum 124, although not shown in the figures, including DIB 110 and vertical probes 114. For this reason vacuum 124 capability may not be needed on a testers wafer chuck 104a. Temperature sensors 312 may be designed on tester dies 126a-n and/or tester modules 406a-n. For this reason, a testers wafer chuck 104a may not need temperature sensors 312. A DUT wafer chuck 104b may be able to step in X and/or Y directions and to rotate to align the DUT pads or bumps with vertical probes 114 and move up and/or down to make contact or separate.

Both a DUT wafer chuck 104b and a testers wafer chuck 104a (e.g., via tester dies 126a-n and/or tester modules 406a-n) may have temperature sensors 312 embedded at different locations. In this embodiment, the temperatures at local regions may be measured by individual sensor slave address selectable by serial bus 122, such as two wire I2C or the like with extended Slave Addresses as shown in FIG. 7A, to save the number of select lines needed. Likewise for heating elements 732 at various local regions as depicted in FIG. 7D.

The DUT wafer 116 and/or DUT chuck 104b temperature may be entirely heated up using the heat dissipated by DUTs 116a-n being tested. Computer simulations based on the thermal characteristics of the system may determine the maximum number and locations of DUTs 116a-n to be tested simultaneously with the cooling 120 capability to reach the desired testing temperature, or the like.

In some embodiments, heating elements 732 around the edge of the DUT chuck 104b may be adjusted higher (e.g., using switches 734) so that the DUT 116a-n temperature will not be affected by the exposed edge, or the like. Multiple coolant paths 120, as depicted in FIG. 7C, in conjunction with local temperature sensors 312 and heating elements 732 allow control of all DUTs 116*a-n* to be tested at desired temperature ranges.

The footprint and/or costs of conventional wafer sorting equipment may limit the testing being done by only one pass at room temperature. So, the "good dies" after one pass at room temperature sorting may not be desirable for Known Good Die (KGD) purposes. Additional temperature tests and wafer level burn-in may be needed.

Many chiplet applications may be in 3D multi-chip package systems. One bad chiplet may ruin an entire system, costing much more than the cost of an individual package. Worse yet, chiplets with soft failure or degradation through their normal lifetime may cause the cost of a bad 3D multi-chip package system in actual application to be much higher.

The MITS described herein, in certain embodiments, offers solutions to these problems. For example, in some embodiments, multiple temperature wafer sorting may be possible. Burn-in type of stress, in further embodiments, may also be possible. Operational temperature guard-band, in certain embodiments, may be possible. Power supplies for the DUT 116*a-n* and tester outputs may be set at different levels as guard-band, or the like.

When testing large number of dies 116*a-n*, even the entire wafer 116 at the same time, the eventual limiting factor may be the heat generated by the DUTs 116*a-n* and/or tester resources. Since the individual tester resources of the described MITS may be controlled individually, the high-power generating tests such as high frequency AC testing of some tester resources may be staggered with low power generating tests such as DC tests or low frequency functional tests at other tester resources. Low frequency functional tests may weed out certain leakage related problems that high frequency functional tests cannot and normal testing protocols cannot afford to perform. This allows more DUTs 116*a-n* to be tested at the same time and with better quality.

The vertical probes 114 and DUT wafer 116 probe pads (or bumps) may be disengaged while they are being transitioned to a new testing temperature. Contact may be made when they reach within a predefined range of temperature difference to ensure less damage to the probes and pads (or bumps).

A calibration wafer and/or a substrate with verified resistors, inductors, and/or capacitor values may be used to calibrate DC testing functions. Calibrated equipment, through inter-DIB board bus 118, inter-tester dies bus 118, and/or inter-tester modules bus 118 may also be used to calibrate DC testing functions. This calibration wafer or substrate may also have functional blocks and/or loop-back features to test and calibrate the AC timing and digital functions. With appropriate adaptors, this test system may be configured to test 3D packaged units and/or sub-system assemblies.

Figure 8:
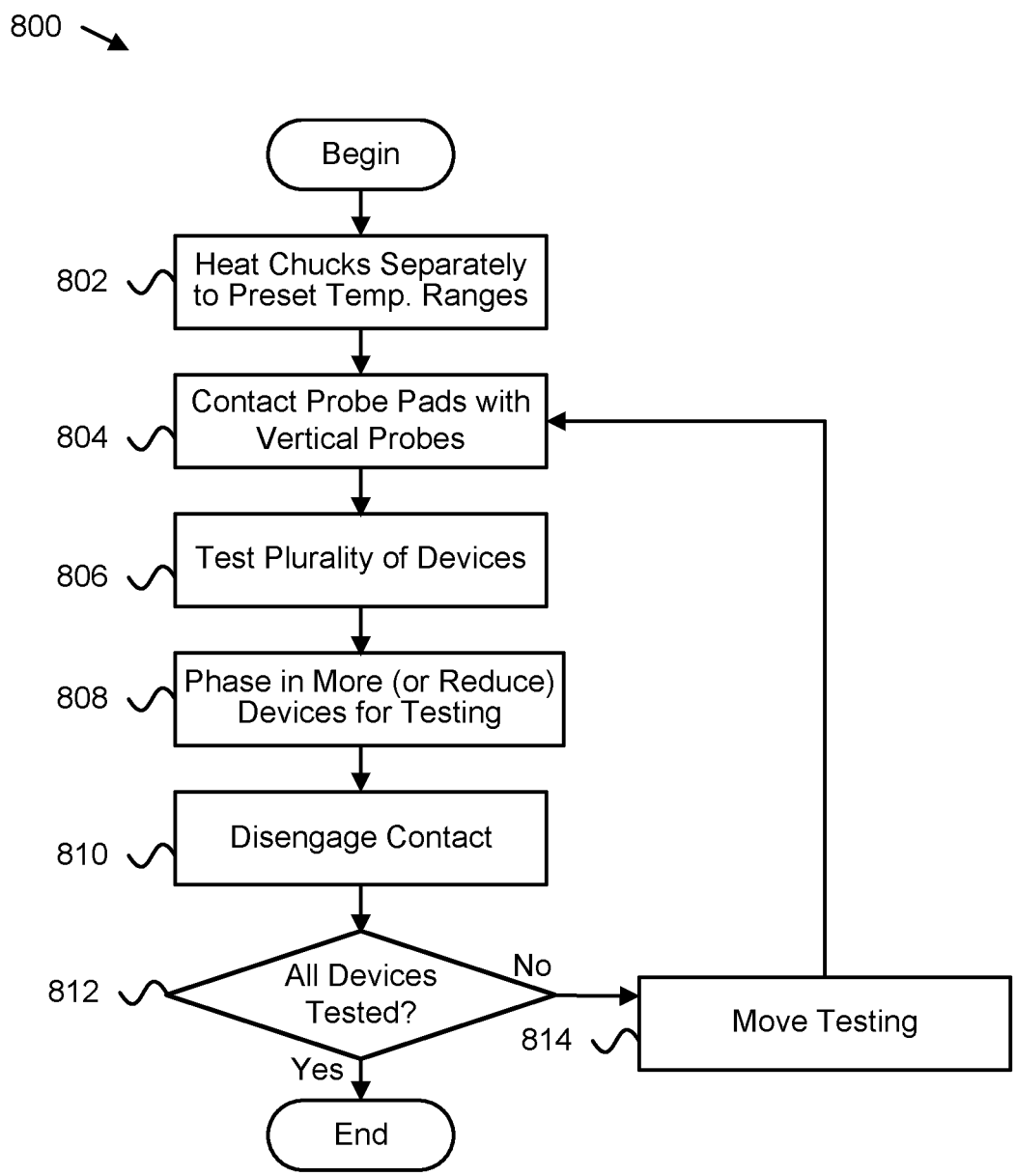
FIG. 8 is a schematic flowchart diagram illustrating one embodiment of a method for a massively independent testers system.

FIG. 8 depicts one embodiment of a method 800 for a massively independent testers system. The method 800 begins and a controller 102, 302 heats 802 first and second temperature-controlled chucks 104*a-b* separately to preset temperature ranges. A controller 102, 302 contacts 804 probe pads of a device under test wafer 116 with vertical probes 114 in communication with tester dies 126*a-n* and/or tester modules 406*a-n*. A controller 102, 302 tests 806 a first plurality of devices 116 *a-n* of the device under test wafer 116.

A controller 102, 302 phases 808 in more devices 116*a-n* (or reduces 808 the number of devices 116*a-n*) of the device under test wafer 116 for testing up to a maximum number of devices 116*a-n* the controller 102, 302 can maintain within the preset temperature range or another desired temperature range for the DUT 116*a-n* and/or the second temperature-controlled chuck 104*b*. A controller 102, 302 disengages 810 the contact 804 of the vertical probes 114 from the probe pads.

A controller 102, 302 determines 812 whether each device 116*a-n* of the device under test wafer 116 has been tested, and the method 800 ends in response to each device 116*a-n* being tested. A controller 102, 302 iteratively moves 814 testing, until each device 116*a-n* of the device under test wafer 116 is tested, to one or more other locations on the device under test wafer 116 in response to each device 116*a-n* of the device under test wafer 116 at a current contact position of the vertical probes 114 and probe pads being tested.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
    a controller;
    multiple independent tester modules each configured to perform both independent functional and parametric tests;
    a substrate, the tester modules mounted on the substrate;
    a device interface board;
    one or more components disposed on the device interface board, the one or more components comprising one or more of a resistor, a capacitor, an inductor, a relay, a power supply, a timing generator, and a precision measurement unit for each of the tester modules, the one or more components being in electrical communication with the tester modules; and
    one or more interface buses in communication with the controller and one or more of the multiple tester modules and the device interface board, the one or more interface buses providing one or more of power and a communication link.

2. The apparatus of claim 1, wherein the multiple tester modules each comprise one or more of:
    a custom tester system on a chip;
    a volatile memory;
    a field programmable gate array; and
    a non-volatile memory comprising one or more of a read-only memory chiplet and a NAND flash chiplet.

3. The apparatus of claim 2, wherein each of the multiple tester modules comprises one or more of a single chiplet and a single die.

4. The apparatus of claim 1, wherein the multiple tester modules each comprise a custom tester system on a chip comprising one or more of:
    a tester controller;
    a test program;
    a memory test address generator;
    a data generator;
    test vectors for digital circuits;
    error random access memory;
    comparators;
    pin electronics and switches;
    power supplies;

reference power supplies;
a phase lock loop;
frequency and timing generators;
analog test functions;
a built-in self-test;
a repair function;
a precision measuring unit;
actual input or output circuits for a device under test in an actual application for the device under test; and
a temperature sensor.

5. The apparatus of claim 1, wherein the device interface board comprises one or more of:
a probe card;
probes;
relays;
passive loads;
active loads;
power supply buses;
timing generators;
a phase lock loop;
volatile buffer memory; and
actual input or output circuits for a device under test in an actual application for the device under test.

6. The apparatus of claim 1, wherein the device interface board comprises one or more of a temperature sensor and an alignment mechanism.

7. The apparatus of claim 1, further comprising a first temperature-controlled chuck and a second temperature-controlled chuck, the substrate and the device interface board coupled to the first temperature-controlled chuck, and a device under test wafer being coupled to the second temperature-controlled chuck.

8. The apparatus of claim 7, wherein the first and second temperature-controlled chucks each comprise local temperature-controlled elements and the second temperature-controlled chuck comprises multiple temperature sensors and a vacuum configured to couple the device under test wafer to the second temperature-controlled chuck.

9. The apparatus of claim 8, wherein the controller is in communication with the multiple tester modules over the one or more interface buses, and the controller is configured to:
heat the first and second temperature-controlled chucks separately to preset temperature ranges;
contact probe pads of the device under test wafer with vertical probes in communication with the tester modules;
test a first plurality of devices of the device under test wafer;
adjust a number of devices of the device under test wafer for testing up to a maximum number of devices the controller can maintain within the preset temperature range for the second temperature-controlled chuck;
disengage the contact of the vertical probes from the probe pads; and
iteratively move testing, until each device of the device under test wafer is tested, to one or more other locations on the device under test wafer in response to each device of the device under test wafer at a current contact position of the vertical probes and probe pads being tested.

10. The apparatus of claim 8, wherein the controller is configured to stagger one or more high power tests by one or more of the multiple tester modules with one or more low power dissipation tests by one or more other tester modules of the multiple tester modules during testing to reduce an overall power generated by devices of the device under test wafer and by tester resources during testing.

11. The apparatus of claim 8, wherein the device interface board comprises a buffer memory compatible with and at least as fast as devices of the device under test wafer.

12. The apparatus of claim 11, wherein the buffer memory is in direct communication with the vertical probes of the device interface board.

13. The apparatus of claim 1, wherein the substrate comprises a single system on a chip die comprising a second controller, random access memory, and a multiplexer.

14. The apparatus of claim 1, wherein one or more of a first temperature-controlled chuck, a second temperature-controlled chuck, and the multiple tester modules comprises a plurality of temperature sensors and heating and cooling elements and the controller is configured to adjust the individual heating and cooling elements to maintain one or more preset temperature ranges.

15. The apparatus of claim 1, wherein the controller is configured to adjust clock frequencies for devices of a device under test wafer to maintain one or more preset temperature ranges.

16. An apparatus, comprising:
a controller;
a testers wafer;
multiple independent tester dies of the testers wafer each configured to perform both independent functional and parametric tests;
a device interface board;
one or more components disposed on the device interface board, the one or more components comprising one or more of a resistor, a capacitor, an inductor, a relay, a power supply, a timing generator, and a precision measurement unit for each of the tester dies, the one or more components being in electrical communication with the tester dies; and
one or more interface buses in communication with the controller and the multiple independent tester dies, the one or more interface buses providing one or more of power and a communication link for the multiple independent tester dies and the controller.

17. The apparatus of claim 16, further comprising a first temperature-controlled chuck and a second temperature-controlled chuck, the testers wafer and the device interface board coupled to the first temperature-controlled chuck, and a device under test wafer being selectively couplable to the second temperature-controlled chuck.

18. The apparatus of claim 17, wherein the controller is in communication with the multiple independent tester dies over the one or more interface busses, and the controller is configured to:
heat the first and second temperature-controlled chucks separately to preset temperature ranges;
contact probe pads of the device under test wafer with vertical probes in communication with the tester dies;
test a first plurality of devices of the device under test wafer;
adjust a number of devices of the device under test wafer for testing up to a maximum number of devices the controller can maintain within the preset temperature range for the second temperature-controlled chuck;
disengage the contact of the vertical probes from the probe pads; and
iteratively move testing, until each device of the device under test is tested, to one or more other locations on the device under test wafer in response to each device of the device under test wafer at a current contact position of the vertical probes and probe pads being tested.

19. A system, comprising:

a first temperature-controlled chuck;

multiple independent tester resource sites each configured to perform both independent functional and parametric tests;

a substrate coupled to the first temperature-controlled chuck;

a device interface board coupled to the substrate, the multiple independent tester resource sites disposed on one or more of the substrate and the device interface board;

one or more components disposed on the device interface board, the one or more components comprising one or more of a resistor, a capacitor, an inductor, a relay, a power supply, a timing generator, and a precision measurement unit for each of the multiple independent tester resource sites;

one or more interface buses in communication with the multiple independent tester resource sites providing one or more of power and a communication link for one or more of power and a communication link for the independent tester resource sites; and a controller in communication with the multiple independent tester resource sites over the one or more interface buses.

20. The system of claim 19, further comprising a second temperature-controlled chuck coupled to a device under test wafer, wherein the controller is configured to:

heat the first and second temperature-controlled chucks separately to preset temperature ranges;

contact probe pads of the device under test wafer with vertical probes in communication with the multiple independent tester resource sites;

test a first plurality of devices of the device under test wafer;

adjust a number of devices of the device under test wafer for testing up to a maximum number of devices the controller can maintain within the preset temperature range for the second temperature-controlled chuck;

disengage the contact of the vertical probes from the probe pads; and iteratively move testing, until each device of the device under test wafer is tested, to one or more other locations on the device under test wafer in response to each device of the device under test wafer at a current contact position of the vertical probes and probe pads being tested.

* * * * *